US006768305B1

United States Patent
Keifer

(10) Patent No.: US 6,768,305 B1
(45) Date of Patent: Jul. 27, 2004

(54) TEMPERATURE CONTROLLED SAMPLE CHANGER FOR NMR ANALYSIS

(75) Inventor: Paul A. Keifer, Omaha, NE (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/672,611

(22) Filed: Sep. 26, 2003

(51) Int. Cl.$^7$ ................................................ G01V 3/00
(52) U.S. Cl. .................................... 324/321; 324/315
(58) Field of Search ......................... 324/321, 315, 324/318, 322, 300, 307, 309

(56) References Cited

U.S. PATENT DOCUMENTS

| | | | |
|---|---|---|---|
| 4,091,323 A | | 5/1978 | Landis |
| 4,120,662 A | | 10/1978 | Fosslien |
| 4,581,583 A | | 4/1986 | Van Vliet et al. |
| 4,859,949 A | * | 8/1989 | McKenna ................ 324/321 |
| 5,146,166 A | * | 9/1992 | Bartuska ................ 324/321 |
| 5,200,702 A | | 4/1993 | Lilly et al. |
| 5,237,276 A | | 8/1993 | Cory |
| 5,847,564 A | | 12/1998 | Smallcombe et al. |
| 5,952,831 A | | 9/1999 | Yamakoshi et al. |
| 6,218,835 B1 | * | 4/2001 | Smallcombe ............ 324/315 |
| 6,414,491 B1 | | 7/2002 | Higgins et al. |

OTHER PUBLICATIONS

Article by Smallcombe et al., entitled "WET Solvent Suppression and Its Applications to LC NMR and High–Resolution NMR Spectroscopy", published by Journal of Magentic Resonance, Series A 117, 295–303 (1995).

* cited by examiner

Primary Examiner—Louis Arana
(74) Attorney, Agent, or Firm—Edward H. Berkowitz; Bella Fishman

(57) ABSTRACT

A queue of samples for NMR analysis is disposed within a thermally isolate NMR magnet bore and distal elements of the queue approach thermal equilibrium concurrently with NMR analysis of a sample within the sensitive volume. In one embodiment, a sequence of NMR sample cells within a barrel coaxial with a vertical bore NMR spectrometer are maintained at a selected temperature by a heated gas and the queue of sample cells advances to the analytic position under gravity when the lowest sample cell is displaced from the queue in response to an end-of-analysis signal generated by said spectrometer.

15 Claims, 2 Drawing Sheets

TEMPERATURE CONTROLLED SAMPLE CHANGER FOR NMR ANALYSIS

FIELD OF THE INVENTION

The invention is in the field of NMR spectroscopy and specifically pertains to rapid replacement of discrete samples in the sensitive volume of an NMR magnet.

BACKGROUND OF THE INVENTION

Variable temperature NMR (VT NMR) has been practiced in prior art with a variety of techniques for securing and maintaining the sample to a desired equilibrium temperature. Many examples of prior art prepare a sample external to the NMR apparatus and then insert the sample into a thermally isolate sample holder within the NMR spectrometer where the sample temperature is restored/maintained through a flowing gas or other agency of thermal control. The NMR analysis is subsequently initiated. Both temporal and thermal inefficiency are features of these arrangements. The time interval for thermal equilibration necessarily includes a further time interval for transfer of the sample if pre-equilibration is carried out external to the NMR spectrometer. The prior art also includes heating a sample external to the spectrometer and then transferring same to the sensitive volume of the analyzer. If the sample is not to be heated again, in situ, the external heating is carried out to bring the sample to a higher temperature than required to balance the cooling expected during the transfer process. Representative examples of this class of prior art have been employed for thermally sensitive analysis.

Temperature control, reliant upon uncontrolled cooling, is undesirable where volume thermal equilibrium is critical and it is also undesirable to subject biological samples to unnecessarily high temperatures. The analysis of samples of biological importance usually requires that the sample temperature be carefully thermostated. In traditional sample-changing apparatuses, although it is possible to design hardware to pre-equilibrate the sample to a given sample temperature while it is outside the NMR magnet (awaiting insertion), it is difficult to maintain that equilibrated temperature during the sample-insertion process itself. (A mechanical arm usually carries the sample tube through an atmosphere of a different temperature to insert it in the bore of the NMR magnet.)

It is also known in prior art to heat samples in situ within the sensitive volume of the NMR apparatus. This occasions a delay for the time interval required to elevate the sample temperature from ambient to the desired analysis temperature. Representative prior art is contained in U.S. Pat. No. 6,218,835 and references therein.

Chemical analytic instruments routinely directed to measurements of a large number of samples require a means for placing the sample in and withdrawing it from the analyzer. A robot arm is frequently employed to carry out vertical and or horizontal mechanical transport of a discrete sample from an array of samples to the operational portion of the analyzer. Some exemplary apparatus prepares precise liquid samples from larger portions, often carrying out preparatory steps of cleansing or dilution as may be required by the specific analytic procedure. Ingenious examples abound in the scientific literature and within the patent records.

Each analytic procedure presents specific requirements for sample and instrument preparation. Within modern NMR instrumentation, exemplary sample-changer apparatuses include carousel and robot arm devices, and direct liquid flow devices. It may be remarked that robot-arm apparatuses are categorically subject to penalties in reduced throughput for the mechanical operations required, are complex in structure, may require precise maintenance and mechanical calibration, and may result in breakage of components. Representative apparatuses of this genre are described in U.S. Pat. No. 4,581,583; 4,091,323. Direct injection via flow apparatus entails risk of undesirable cross contamination of samples, and may add complexity in sample source identification.

Prior art also includes apparatuses for conveying a train of sample cells through the bore of an analytic NMR system. U.S. Pat. No. 6,414,491 describes an apparatus for conveying sample cells along a helical path through the bore of an NMR spectrometer. A rotating auger carries the samples over the helical path to a position above a central axial position for measurement. Upon completion of measurement of a previous sample cell, an aperture opens to permit the next sample cell to be radially guided from its off axis (helical path) position to a position on the bore of the magnet and within the NMR probe for analysis. Following the measurement, an aperture below the sample cell opens to allow the sample cell to fall through the remaining portion of the magnet bore to a collecting bin. The mechanism for effecting this trajectory of conveyance requires a degree of complexity evidenced by a decided departure from magnetic homogeneity in the bore space occupied by the helical conveyance mechanism. The magnetic asymmetry due to the finite magnetic susceptibility of the components of the apparatus requires complex field shimming.

It is apparent that prior art controlled temperature analysis imposes a time burden for the analysis of a number of samples and that prolonged exposure at elevated temperatures often results in unacceptable degradation of samples.

SUMMARY OF THE INVENTION

A barrel, coaxially disposed within the bore of a vertically oriented NMR magnet, houses a sample transport apparatus for guiding a sequence of discrete sample containers through the NMR probe within the bore to occupy the desired measurement position in respect to the RF coil of the probe for analysis. At the same time, the barrel serves to provide an isothermal environment for the queue of samples. Considerable efficiency is obtained by the concurrency of NMR analysis of one sample while the next to be analyzed sample is maintained at the desired temperature and still other samples are approaching thermal equilibrium.

In one such sample transport apparatus, the vertical stack of samples rests upon a lowest sample, in turn resting upon a base. The base is capable of discrete motion in various embodiments, adapted to remove the lowest sample container from the stack, allowing the rest of the stack to descend under gravity, thus bringing the next sample into position in respect to the RF coil. At the conclusion of the analysis corresponding to a specific sample, the NMR system controller generates an end-of-analysis signal and in response thereto the lowest sample is removed. A measured discrete rotation or translation of the movable base is sufficient for this purpose. The removed samples can then drop into a sample container designed to contain spillage in the event of sample container breakage. Alternatively, a conveyor belt, for example may remove samples from the immediate vicinity of the base of the column.

In one approach to achieving an isothermal environment, the barrel desirably serves to contain a column of thermally regulated gas to maintain samples at a selected temperature.

In alternative embodiments samples are preheated directly by (non-resonant) RF irradiation or by resistive heating, within the magnet bore, of the immediate surrounds of the sample at a pre-analysis position.

DETAILED DESCRIPTION OF THE INVENTION

Figure 1:
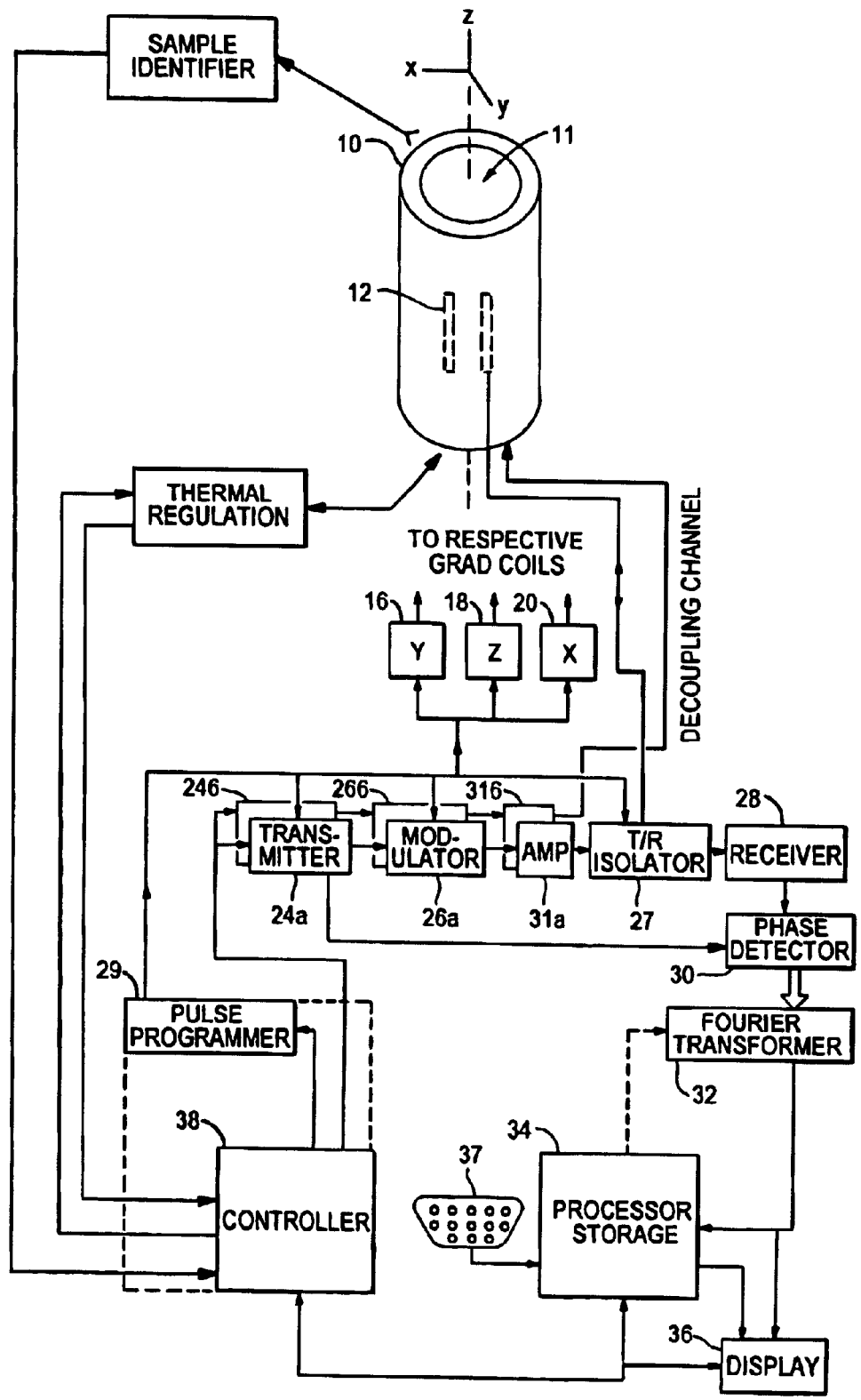
FIG. 1 illustrates the context of the invention.

In FIG. 1 there is shown in block form a typical NMR apparatus. A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, RF power is provided from first transmitter 24a, and is amplified by an amplifier 31 and then directed via transmit/receive (T/R) isolator 27 to the probe 12 that includes RF transmitter coil located within the bore 11. The transmitter 24 may be modulated in amplitude or frequency or phase or combinations thereof, either upon generation or by a modulator 26. Additional transmitter 24b/modulator 26b components are often employed to independently excite different gyromagnetic resonators, e.g., protons and $C^{13}$. These independent excitations are conveniently supported by a multiply resonant coil as described herein. Transmit and receive functions are not concurrently active. The identical coil within probe 12 may be employed for both functions if so desired. Thus, the T/R isolator 27 is provided to separate the receiver from the transmitter. In the case of separate transmitter and receiver coils, element 27 will perform a similar isolation function to control receiver operation.

The modulator 26 is responsive to controller 38 including pulse programmer 29 to provide RF pulses of desired amplitude, duration and phase relative to the RF carrier at preselected time intervals. The pulse programmer may have hardware and/or software attributes. The pulse programmer also controls the gradient power supplies 16, 18 and 20, if such gradients are required. These gradient power supplies may impose gradient pulses or maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit of processor 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more digital processors, controls and correlates the time critical operations, such as the performance of pulse sequences. Controller 38 ordinarily incorporates an independent time base for maintaining synchrony with resonant spin systems. Overall operation of the entire apparatus within processor 34 includes input 37 from operating personnel, non-time critical calculation and output for further processing or display.

Figure 2:
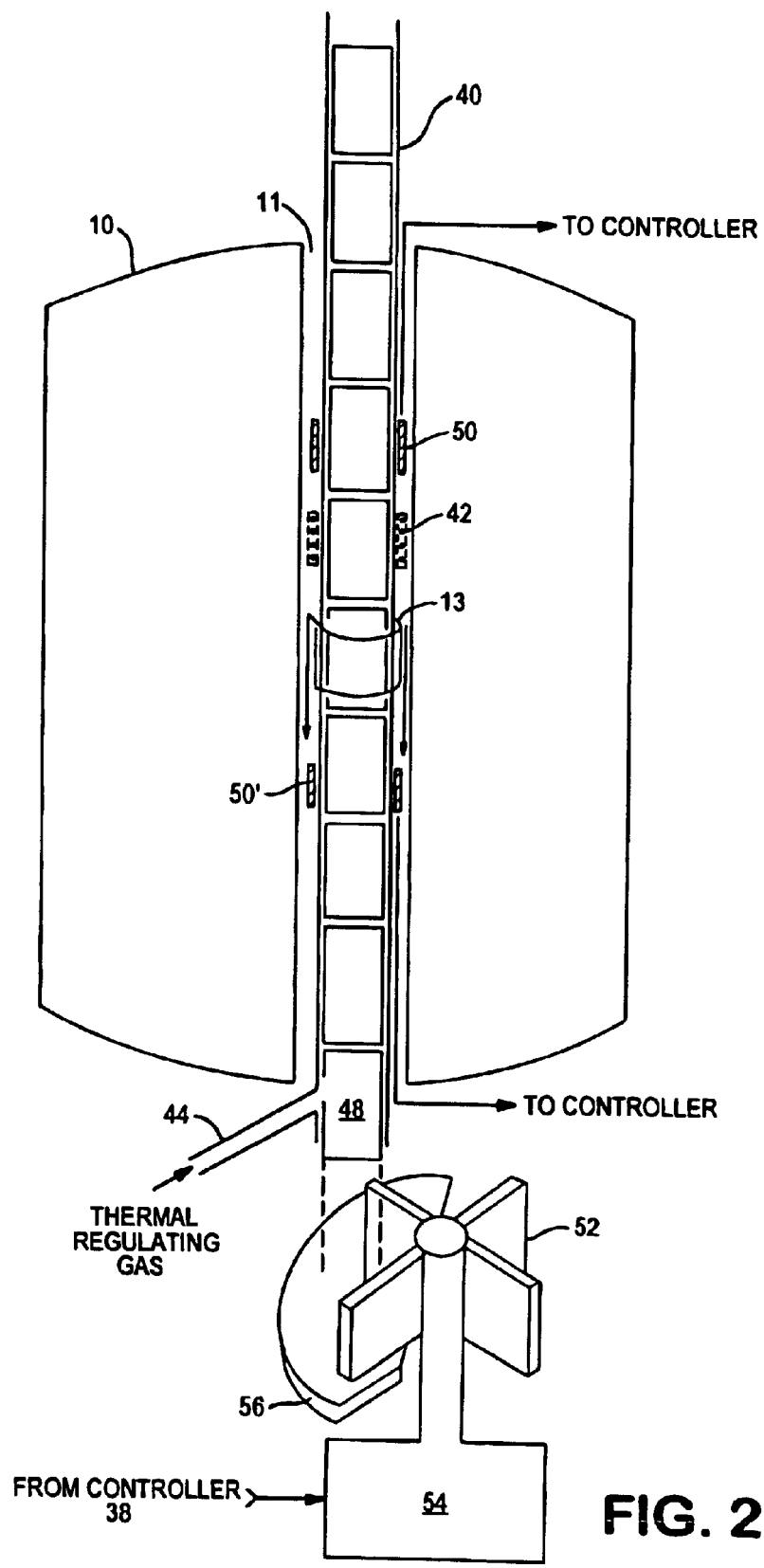
FIG. 2 shows the conceptual basis of the invention.

FIG. 2 in partial section schematizes a description of the preferred embodiment. The magnet 10 is a conventional vertical bore cryostat with a barrel 40 fitted to coaxial alignment with bore 11. RF coil 13 of probe 12 is disposed substantially in the axially central portion of the bore 11. Barrel 40 extends well beyond the top of magnet 10 providing an extended queue 60 of liquid samples 60a, 60b, . . . 60i contained in respective sample tubes. At the base of barrel 40 there is provided a sidearm 44 for introducing a controlled temperature gas for temperature control of the samples. Additionally, RF heating coils 42 may be provided to rapidly bring the samples to an elevated temperature, prior to analysis. Sample-removal device 46 (described below) receives a signal from controller 38 causing removal of the lowest sample 48 from the queue, thus permitting the sample queue to advance through gravity by one sample, bringing the next sample for analysis into alignment with analytic RF coil 13. Identification of a sample may be accomplished at some displacement from the analysis site, for example, through barcode reader 50 located above the RF coil 13 (identifying to the controller 38 the sample about to be analyzed), while a second barcode reader 50' located below RF coil 13 is to identify the sample most recently analyzed. Controller 38 compares the signals from the two barcode readers (after accounting for the time lag due to sample movement) confirming the identity of the sample most recently analyzed and providing verification that no sample "jams" had occurred.

A sample nominally positioned for analysis may be further prepared for analysis by compensation of the disturbance of the local polarizing magnetic field due to the difference of magnetic susceptibility of the sample/sample cell with its environment. For a sequence of nominally similar sample's sample cells, susceptibility correction is an unlikely requirement, although each sample may be examined to so determine. This shimming operation is a well known procedure that is ordinarily based upon a sample spectral line shape There are two indications that a sample for analysis is properly centered within RF coil 13. The first indication comes from a comparison of the data output from the barcode readers 50 and 50'. If these sample bar codes do not provide the expected sample identifiers, there is a large error in the position of the sample queue. That is, there is either a jam or the sample queue is empty. To avoid small (spatial) errors in the placement of the sample container within the RF coil 13, the Scout-scan technique provides a preferred form of position monitor. This technique is described in both U.S. Pat. No. 5,847,564 and in the literature (S. H. Smallcombe, S. L. Patt, and P. A. Keifer, J. Magn. Reson. A, 117, 1995, pages 295–303). For the samples intended for this analyzer, usually biological in nature and therefore containing $H_2O$, the linewidth (and the lineshape and the height) of the water resonance acquired during the initial Scout-scan spectrum will be degraded significantly if the sample position is incorrect or the sample itself has somehow precipitated, or physically degraded, or if the volume of the sample in the container is too small (from insufficient filling or leakage) or if the magnetic susceptibility of the sample greater than acceptable limits. Controller 38 compares the Scout-scan-spectrum lineshape obtained on the current sample to a set of criteria, and reject the sample prior to analysis (or reject the sample's data after analysis) if the Scout-scan-spectrum lineshape is beyond an acceptable variance. Evaluation of the Scout-scan lineshape is easily completed in real time, allowing the invention to advance the sample queue before the final spectrum is acquired on a sample to be rejected, or to mark the data from such rejected sample after it has been acquired and stored, so that data acquired from this particular sample data can be disregarded. Thus the Scout-scan procedure may be employed to confirm the geometric alignment of the sample, its condition and magnetic susceptibility specification prior to the detailed analytic spectral measurement.

An additional device, for example an optical detector, could be added to distinguish between an unsuitable sample and a slightly misaligned sample.

Several embodiments of sample-heating techniques are feasible. The preferred method is the use of sidearm 44 to deliver a controlled-temperature gas for temperature control of the samples. The thermally controlled gas column is allowed to convect through the barrel. For a purely convectively preheating embodiment, the duration of sample preheating depends upon the length of the extension of the barrel 40 above the analysis zone, e.g., within RF coil 13, the length of samples 60a, etc., and the analysis time for each sample. A more rapid sample analysis interval combined with a longer preheating time suggests a longer barrel extension and/or shorter sample lengths. Combining a shorter preheating interval with a shorter analysis interval implies a shorter extension of barrel 40 and/or longer sample tubes. While the ranges of these variables are distinctly limited by practical considerations, the analysis time may be artificially extended by a controlled delay between sample analysis: however, that may not be an acceptable alternative where greater throughput is paramount.

An additional optional method is to use RF heating coils 42, located upstream in the sample queue, to induce a rapid but controlled increase in the sample temperature of each sample, as needed, just prior to analysis. Such RF heating coils 42 are not limited to the solenoidal form as suggested by FIG. 2, and can be realized in saddle coil form. (It may be observed that the solenoidal form geometrically limits RF excitation in the polarizing field, thereby avoiding some unintended result.) Generally, any RF frequency remote from proton excitation may be acceptable for this purpose. Such RF preheating exposure by this embodiment is directly controllable in depositing a measured quantity of thermal energy in the sample.

A variation on direct sample heating is achievable in another embodiment by resistive heating of a portion of the barrel 40. A current may be passed directly through the barrel portion, or such portion may be heated by resistive wire windings. The axial displacement from the analysis zone for the resistively heated portion of the barrel 40 is sufficient to provide correctable or insignificant magnetic disturbance to the analysis. Although this embodiment does not allow the equilibrium temperature of the sample to be changed rapidly, a rapid temperature change is not needed when the invention is installed for a given analysis (that requires a fixed elevated temperature). This embodiment provides a measure of simplicity and economy (by removing the need to supply a steady flow of temperature-regulated gas). Other and additional preheating moduli will occur to one of skill in the art For example, optical means may be employed to provide a controlled deposit of heat to a sample in a selected position. Combinations of the purely convective preheating with either a selective preheating via RF irradiation, resisitive heating or optical means may also serve.

Several alternative embodiments of the sample-removal device 46 are feasible. One arrangement for removing the lowest sample 48 from the queue is specifically described in FIG. 2. A vertical-axis paddlewheel 52 is driven by a stepper motor 54. Stepper motor 54 is actuated by controller 38 at the conclusion of analysis and rotates through an angle adequate to displace sample 48 from shelf 56 supporting the queue of sample cells. The sample cells thus displaced may be collected in a bin (not shown) in standard fashion The stepper motor 54 may be specified by the torque necessary to effect this displacement under the axial load of the supported samples, or an additional mechanical restraint (not shown) may be employed to reduce this load.

Although the vertical-axis-paddlewheel configuration is preferred, another embodiment of the sample-removal device 46 places the paddlewheel vanes on a horizontal shaft, allowing the lowest sample 48 to be removed downward from the queue rather than by a sideways translation. This horizontal-axis-paddlewheel version can hold 1–2 samples between vanes of the paddlewheel in the interval from removal from the queue and disposal to a waste bucket (The matter of breakage of sample cells may be mitigated by the use of a plastic waste bucket, or equivalent, and unbreakable sample containers.) Yet another embodiment employs a sliding shuttle to remove the lowest sample 48 from its position at the base of the queue. All of these embodiments may be located external to the magnet (as shown in FIG. 2.)

It should be observed that sample tubes containing respective samples experience automated handling and are subject to breakage. Sample tubes constructed of generic plastic have been employed and surprisingly, found to present no significant obstacle to No analysis for most purposes. It is conjectured that the spin resonances present in the material of the plastic matrix are typically quite broad in relation to resonances of interest in the fluid samples. Known techniques may be employed, if desired, to further reduce such effects. Such sample tubes are essentially unbreakable in this usage as well as inexpensive and disposable.

Other embodiments of the sample-removal device 46 may be located within the bore 11, closer to the RF coil 13, and may take a wide variety of forms. As an example, if the sample-removal device is located within the magnet bore 11, it may consist of a lever or a pin, or a pair of synchronized levers or pins, which are maintained in substantially horizontal alignment so as to mechanically restrain the sample container until the analysis is complete. When an end-of-analysis trigger is generated by process controller 38, these mechanical restraints are withdrawn or dropped vertically in a synchronized fashion, so as to allow one (and only one) sample to drop.

In accord with typical practice as above discussed, a bar-code reader 50 may be incorporated in the apparatus at the top of the barrel 40 for forward sample identification. When the queue is essentially exhausted at the bar-code reader position or the equivalent, the number of remaining sample cells is known and the instrument is shut down at the conclusion of the last sample-cell measurement or an indicator is actuated to call for the queue to be replenished with more sample cells.

The components within the bore in the immediate vicinity of the RF coil are cylindrically symmetric and contribute no unusual magnetic inhomogeneity. This reduces the shimming of the magnetic field, which might otherwise be occasioned by a more complex and axially asymmetric mechanism within the bore. However, it may be desirable where the particular measurement so requires, to incorporate other apparatus, such as RF heating coils 42, positioned appropriately above and at some remove from the measurement space.

In automated sample-changing apparatuses, the throughput is limited by the discrete operations of the removal of the recently measured sample followed by the insertion of the next sample for measurement The present invention overlaps these operations in that the sample-queue motion replaces the prior-measured sample with the next sample in the same motion. There is no interval of any duration between these basic operations. In addition, the total time required for the sample-changing operation has now been reduced to only a matter of seconds. (It consists only of the time needed to remove the bottom sample out of the stack and allow the other samples to drop one sample-tube height—typically, a distance of less than 5 cm—down the bore tube.) Throughput is therefore limited entirely by the measurement process itself and the time interval for the sample queue to move through the axial length of a single sample cell.

The invention presented here is designed to pre-equilibrate each sample to the desired temperature, and then maintain that temperature without any interruption during the sample-insertion process. As a result, the equilibrium temperature is better maintained, both by greatly reducing the sample-changing time, and by keeping the samples at a constant temperature within the sample changer (disposed within bore 11) during the entire sample-changing process.

In addition, the NMR analysis of samples of biological importance may require the samples to be heated to a temperature that may unfortunately accelerate the rate of sample decomposition. Although it is needed to maintain the sample at the elevated temperature during the analysis itself, it is desirable to ensure that the duration of the sample heating is no longer than necessary prior to the analysis. In traditional sample-changing apparatuses, if hardware is used to pre-equilibrate (usually heat) the samples to a given sample temperature while they are outside the magnet (awaiting insertion), this heating is normally applied to all the samples in the queue. This is undesirable because of the potential for sample degradation. The system presented here is designed to maximize sample heating efficiency; it both minimizes the duration of sample heating prior to the analysis, and it provides the best opportunity to maintain a stable temperature (as outlined above).

The inventive sample-changing apparatus presents an unambiguous unidirectional FIFO (first-in first-out) sequence of samples, in contrast to the robot arm devices that may be subject to malfunction resulting in an undesired reordering of samples. Sample flow is accomplished in a simple straightforward manner without pneumatic plumbing to power lifting operations. The structure of the present invention offers ultimate simplicity and minimal disturbance to the magnetic homogeneity of the bore region of the magnet. Without provision for spinning the sample cell, the simple vertical queue embodiment provides for azimuthal magnetic homogeneity to a substantial degree and the preservation of radial and axial symmetry greatly simplifies operation of the NMR spectrometer.

In addition, for those samples that do not require extensive signal averaging to yield acceptable data, in which the sample-changing time may otherwise be a significant part of the total analysis time, the FIFO geometry provides the best opportunity for increasing sample throughput.

Although this invention has been described with reference to particular embodiments and examples, other modifications and variations will occur to those skilled in the art in view of the above teachings. The invention may be usefully employed to automate the screening of a large number of samples with a maximal throughput. It should be understood that, within the scope of the appended claims, this invention may be practiced otherwise than as specifically described.

What is claimed is:

1. A sample-cell sequencer for an NMR apparatus including a vertical-bore NMR magnet and an RF probe coil, comprising
   a guide internally coaxial with said bore for maintaining a stable stack of said sample cells, one said cell occupying a measurement space radially surrounded by said RF probe coil,
   a base disposed below said bore for supporting said stack,
   a sample-cell removing device for displacing a sample cell resting upon said base from the position thereof at the lowest position of said stack, whereby remaining said sample cells fall vertically and another sample cell occupies said measurement space,
   a source of gas at selected temperature and wherein said guide conducts said gas of selected temperature upwardly through said guide to maintain said stack at a desired temperature.

2. The sample-cell sequencer of claim 1 further comprising a bar code reader for identifying each sample cell.

3. The sample-cell sequencer of claim 1 wherein said base supports a lowest sample cell in turn supporting said stack and a motor for causing displacement of said lowest sample cell from its position whereby the remainder of said cells of said stack descend.

4. The sample-cell sequencer of claim 3 wherein said base further comprises a horizontally rotating paddlewheel having vanes of sufficient angular separation to encompass said lowest sample cell, and said motor comprises a stepper motor coupled to said paddlewheel whereby rotation of said paddlewheel by a selected angular increment displaces said lowest sample cell and said queue of sample cells descends by one said cell.

5. The sample-cell sequencer of claim 1 wherein a heating device is disposed within said bore at an axial displacement from said measurement space whereby a sample cell is heated prior to occupying said sample space.

6. The sample cell sequencer of claim 5 wherein said heating device comprises an RF coil for heating a sample cell proximate thereto by induction coupling.

7. The sample-cell sequencer of claim 1 wherein each said sample cell comprises a substantially cylindrical hollow member of plastic.

8. The method of sequencing a queue of sample cells, each said cells of identical axial extent, for analysis in a vertical axial bore NMR spectrometer having an analytic RF coil, comprising the steps of:
   aligning and confining said queue of samples within said bore;

disposing said queue to radially align one said sample container with said RF coil while resting a lowest sample cell axially beyond said RF coil;

analyzing one said sample;

thermally conditioning the cells of said queue whereby the thermal environment of said queue is controlled; and causing said lowest sample cell to be displaced from said queue, whereby another sample cell falls into position with respect to said RF coil.

9. The method of claim 8 wherein said step of aligning and confining further comprises applying heat directly to at least one said cell of said queue.

10. The method of claim 8 wherein said step of thermally conditioning comprises directing a thermally regulated gas to circulate axially among the cells of said queue whereby said thermal environment of said queue is controlled.

11. The method of analyzing one sample and equilibrating at least one additional sample comprising a plurality of discrete samples for NMR analysis at a selected temperature within an NMR apparatus having an axial bore having an entry end and an exit end and a uniform magnetic field along the axis of said bore, comprising the steps of a) disposing one said sample of said plurality within an analysis space of said axial bore for analysis therein, b) arranging said plurality within said bore to form a substantially axial sequence, c) controlling the temperature within said bore whereby at least one of said at least one additional samples acquires a temperature approaching said selected temperature, d) analyzing said one said sample, e) removing said one said sample from said analysis space, and directing said analyzed sample to the exit of said bore f) advancing said at least one additional sample to said analysis space.

12. The method of claim 11 comprising repetition of steps (c) through (f) for analysis of said plurality of samples.

13. The method of claim 12 further comprising causing further samples to enter said entry end of said bore.

14. The method of claim 11 wherein step (d) further comprises acquiring a preliminary spectral response for confirming the conditions of said sample for analysis.

15. The method of claim 14 wherein step (d) further comprises ascertaining that any magnetic disturbance from said sample is insubstantial.

* * * * *